United States Patent
Eihama

(10) Patent No.: US 10,574,206 B2
(45) Date of Patent: Feb. 25, 2020

(54) MULTIPLEXER

(71) Applicant: Murata Manufacturing Co., Ltd., Nagaokakyo-shi, Kyoto-fu (JP)

(72) Inventor: Toru Eihama, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/015,347

(22) Filed: Jun. 22, 2018

(65) Prior Publication Data

US 2018/0302059 A1  Oct. 18, 2018

Related U.S. Application Data

(63) Continuation of application No. PCT/JP2016/084147, filed on Nov. 17, 2016.

(30) Foreign Application Priority Data

Dec. 28, 2015 (JP) .................................. 2015-257469

(51) Int. Cl.
*H03H 7/46* (2006.01)
*H03H 9/05* (2006.01)
(Continued)

(52) U.S. Cl.
CPC .......... *H03H 7/461* (2013.01); *H01P 1/2135* (2013.01); *H03H 7/38* (2013.01); *H03H 7/463* (2013.01);
(Continued)

(58) Field of Classification Search
CPC .......... H03H 7/461; H03H 7/38; H03H 7/463; H03H 9/0542; H03H 9/0557;
(Continued)

(56) References Cited

U.S. PATENT DOCUMENTS 6,118,985 A  9/2000  Kawakyu et al.
6,222,426 B1  4/2001  Komazaki et al.
(Continued)

FOREIGN PATENT DOCUMENTS

JP  11-046101 A  2/1999
JP  2008-067413 A  3/2008
(Continued)

OTHER PUBLICATIONS

Official Communication issued in International Patent Application No. PCT/JP2016/084147, dated Feb. 7, 2017.

*Primary Examiner* — Robert J Pascal
*Assistant Examiner* — Kimberly E Glenn
(74) *Attorney, Agent, or Firm* — Keating & Bennett, LLP

(57) ABSTRACT

A multiplexer includes a first filter, a second filter, a combining wiring line that provides a combination point at which an input or an output of each of the first filter and the second filter is connected to each other, an antenna terminal to connect the multiplexer to an antenna, an antenna wiring line connected at one end to the antenna terminal and connected at the other end to the combining wiring line, a matching terminal to which a matching inductor to provide matching between the antenna and the multiplexer is to be connected, and a matching wiring line to be connected at one end to the matching terminal and connected at the other end to the combining wiring line.

16 Claims, 9 Drawing Sheets

(51) Int. Cl.
*H01P 1/213* (2006.01)
*H03H 7/38* (2006.01)
*H03H 9/46* (2006.01)
*H05K 1/18* (2006.01)
*H05K 1/02* (2006.01)
*H05K 1/16* (2006.01)

(52) U.S. Cl.
CPC ........ *H03H 9/0542* (2013.01); *H03H 9/0557* (2013.01); *H03H 9/0576* (2013.01); *H03H 9/46* (2013.01); *H05K 1/185* (2013.01); *H05K 1/025* (2013.01); *H05K 1/165* (2013.01); *H05K 2201/1006* (2013.01); *H05K 2201/10083* (2013.01)

(58) Field of Classification Search
CPC ...... H03H 9/0576; H03H 9/46; H01P 1/2135; H05K 1/185; H05K 1/025; H05K 2201/1006; H05K 2201/10083

USPC ........................................................ 333/125
See application file for complete search history.

(56) References Cited

U.S. PATENT DOCUMENTS

| 8,994,472 B2* | 3/2015 | Yamaji ............... H03H 9/14535 333/133 |
| 2008/0238567 A1 | 10/2008 | Rosetti et al. |
| 2012/0208591 A1 | 8/2012 | Uejima |
| 2013/0229242 A1 | 9/2013 | Takata |

FOREIGN PATENT DOCUMENTS

| JP | 2009-508417 A | 2/2009 |
| JP | 2012-044290 A | 3/2012 |
| JP | 5310873 B2 | 10/2013 |

* cited by examiner

MULTIPLEXER

CROSS REFERENCE TO RELATED APPLICATIONS

This application claims the benefit of priority to Japanese Patent Application No. 2015-257469 filed on Dec. 28, 2015 and is a Continuation Application of PCT Application No. PCT/JP2016/084147 filed on Nov. 17, 2016. The entire contents of each application are hereby incorporated herein by reference.

BACKGROUND OF THE INVENTION

1. Field of the Invention

The present invention relates to a multiplexer including filters.

2. Description of the Related Art

There is a need for communication equipment such as a cellular phone handset that supports frequency bands and wireless systems, that is, a multi-band and a multi-mode. In a multiplexer that is proposed to fulfill the need and that includes filters, a combination point at which the filters are connected to each other (that is, the filters are combined) is connected to a common antenna terminal (see, for example, Japanese Patent No. 5310873). The multiplexer is assumed to match impedances between an antenna and the multiplexer in a manner in which a matching device, such as a shunt inductor, is disposed between the antenna and the combination point.

With the above structure, however, the combination point and the matching device are connected to each other with a transmission line that connects the combination point and the antenna terminal of the multiplexer interposed therebetween. Accordingly, a reflection phase at a contact of the matching device rotates (shifts) in accordance with the electrical length of the transmission line as compared with a reflection phase at the combination point. Consequently, an impedance at the contact is lower than a predetermined impedance (for example, 50Ω) for impedance matching in some cases. In these cases, it is difficult to match an impedance at the antenna terminal to the predetermined impedance even when the shunt inductor serving as the matching device is connected to the antenna terminal, and there is a problem in that the impedance matching cannot be achieved.

Even with such a structure, the impedance at the antenna terminal is able to be matched to the predetermined impedance in a manner in which a matching device, such as a capacitor is added. In this case, however, the additional matching device causes another problem in that a decrease in cost and size cannot be achieved.

SUMMARY OF THE INVENTION

Preferred embodiments the present invention provide multiplexers that each enable the impedance matching with a simple matching device.

A multiplexer according to a preferred embodiment of the present invention includes filters, a combining wiring line that provides a combination point at which an input side or an output side of each filter is connected to each other, an antenna terminal to connect the multiplexer to an antenna, an antenna wiring line that is connected at one end to the antenna terminal and that is connected at the other end to the combining wiring line, a matching terminal to which a matching device to provide matching between the antenna and the multiplexer is to be connected, and a matching wiring line to be connected at one end to the matching terminal and connected at the other end to the combining wiring line.

With this structure, the matching device is connected to the combination point without interposing the antenna wiring line, and the impedance at the antenna terminal is highly unlikely to be affected by the electrical length of the antenna wiring line. Consequently, the multiplexer enables impedance matching with the matching device that is simple.

The other end of the antenna wiring line and the other end of the matching wiring line may be connected to the combining wiring line at the same or substantially the same position.

With this structure, the number of connection nodes of the combining wiring line is decreased. Consequently, an area in which the connection nodes are disposed is small, and the size of the multiplexer is decreased.

A substrate may include the antenna wiring line and the matching wiring line, and the antenna wiring line and the matching wiring line may be provided on an opposite side of the combining wiring line from each other in a plan view of the substrate.

With this structure, an area in which the antenna wiring line and the matching wiring line are disposed is small, and the size of the multiplexer is decreased.

The antenna wiring line and the matching wiring line may be perpendicular or substantially perpendicular to the combining wiring line in the plan view of the substrate.

With this structure, the area in which the antenna wiring line and the matching wiring line are disposed is even smaller, and the size of the multiplexer is further decreased.

The multiplexer may include the matching device that is connected to the matching terminal.

The multiplexer that includes the matching device enables the impedance matching without an external matching device.

The matching device may be an inductor that is connected between the matching terminal and a ground potential. The inductor may have an inductance that causes an impedance at the antenna terminal to match a predetermined impedance due to a combined inductance of the inductor and the matching wiring line having an inductance that is determined in accordance with an electrical length.

With this structure, the multiplexer enables the impedance matching more successfully.

The multiplexers according to preferred embodiments of the present invention enable the impedance matching with a simple matching device.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
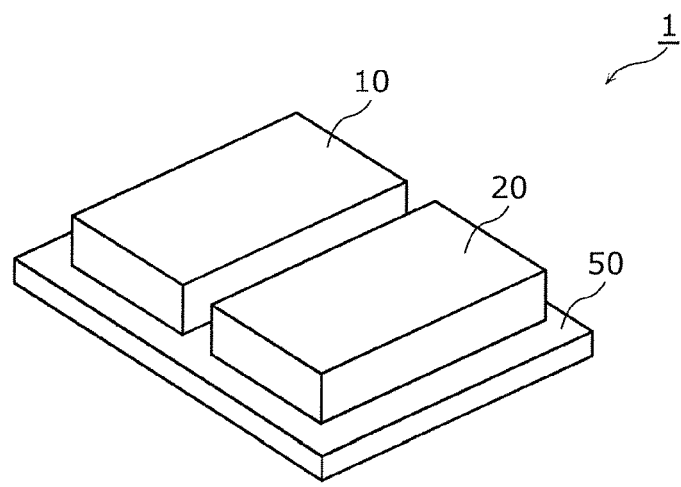
FIG. 1 is a perspective view of an example of the appearance of a multiplexer according to a preferred embodiment of the present invention.

Preferred embodiments of the present invention will hereinafter be described in detail with reference to the drawings. The preferred embodiments described below are comprehensive or specific examples. In the following description according to preferred embodiments, numerical values, shapes, materials, components, and the arrangement and connection configuration of the components are described by way of example and do not limit the present invention. Among the components according to preferred embodiments described below, components that are not recited in the independent claim are described as optional components. In the preferred embodiments described below, the phrase "to be connected" means not only a direct connection but also an electrical connection with another device interposed therebetween.

The drawings are schematically illustrated and are not necessarily illustrated strictly. Accordingly, the size of each component illustrated in the drawings or the ratio of the size is not necessarily illustrated strictly. In the drawings, components having the same or substantially the same structure are designated by like reference numbers, and a duplicated description is omitted or simplified in some cases. In the following description, the expression "substantially the same", for example, is used in some cases and means not only completely identical but also substantially identical. The meaning of "substantially" contains an error of about several percent. In the following description, hatching is used to illustrate not only a sectional view but also a layout view for simplification and clarity in some cases. In the following description, an impedance chart and an immittance chart are not distinguished from each other and are described as Smith charts.

Figure 2:
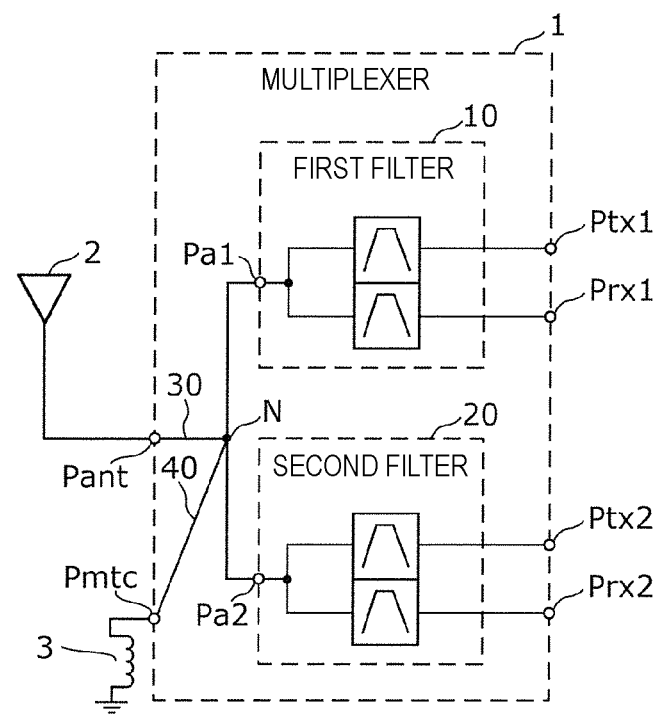
FIG. 2 is a circuit diagram of a multiplexer according to a preferred embodiment of the present invention.

FIG. 1 is a perspective view of an example of the appearance of a multiplexer 1 according to a preferred embodiment of the present invention. FIG. 2 is a circuit diagram of the multiplexer 1. In FIG. 2, external components (here, an antenna and a matching inductor 3) that will be connected to the multiplexer 1 are illustrated together. The same is true for the other circuit diagrams described later.

The multiplexer 1 illustrated in the figures preferably supports, for example, LTE (Long Term Evolution) and transmits high-frequency signals in Bands that meet a communication standard such as 3GPP (Third Generation Partnership Project). Specifically, the multiplexer 1 is used in a front end of a cellular phone that supports a multi-band and transmits transmission signals (high-frequency transmission signals) or reception signals (high-frequency reception signals) in frequency bands (Bands) between the antenna 2 and a RFIC (Radio Frequency Integrated Circuit, not illustrated). According to the present preferred embodiment, the multiplexer 1 is preferably a quadplexer used in Band12 (a transmission pass band of about 699 MHz to about 716 MHz, and a reception pass band of about 729 MHz to about 746 MHz) and Band5 (a transmission pass band of about 824 MHz to about 849 MHz, and a reception pass band of about 869 MHz to about 894 MHz), for example.

Specifically, as illustrated in FIG. 1 and FIG. 2, the multiplexer 1 includes a first filter 10, a second filter 20, an antenna wiring line 30, a matching wiring line 40, and a package substrate 50. The multiplexer 1 also includes an antenna terminal Pant, a matching terminal Pmtc, transmission terminals Ptx1 and Ptx2, and reception terminals Prx1 and Prx2 that define and function as external-connection terminals.

The structure of the multiplexer 1 will now be described in detail.

The first filter 10 is preferably a duplexer that supports Band12, includes a transmission filter and a reception filter of Band12, and is mounted on the package substrate by FCB (Flip Chip Bonding).

Specifically, the first filter 10 includes a common terminal Pa1 corresponding to an antenna terminal that connects (combines) the transmission filter and the reception filter of Band12 to each other, filters transmission signals input from the transmission terminal Ptx1 in the transmission pass band of Band12, and outputs the filtered transmission signals from the common terminal Pa1. The first filter 10 filters reception signals input into the common terminal Pa1 in the reception pass band of Band12 and outputs the filtered reception signals to the reception terminal Prx1.

The second filter 20 is preferably a duplexer that supports Band5 and includes a common terminal Pa2. The specific structure of the second filter 20 is the same or substantially the same as in the first filter 10, except that the supported Band differs, and is simplified in the following description. The second filter 20 filters transmission signals input into the transmission terminal Ptx2 and outputs the filtered transmission signals from the common terminal Pa2, and filters reception signals input into the common terminal Pa2 and outputs the filtered reception signals from the reception terminal Prx2.

As illustrated in FIG. 2, a transmission line that connects the common terminal Pa1 and the antenna terminal Pant to each other and a transmission line that connects the common terminal Pa2 and the antenna terminal Pant to each other are combined at a combination point N into a common line, which is shared by the first filter 10 and the second filter 20 and is connected to the antenna terminal Pant. That is, the combination point N is a point at which the input or the output of each filter (the first filter 10 and the second filter 20 according to the preferred embodiment) is connected to each other (combined).

According to the present preferred embodiment, the first filter 10 and the second filter 20 are preferably piezoelectric material chips including respective surface acoustic wave filters that use a surface acoustic wave (SAW), for example.

The first filter 10 and the second filter 20 are not limited to elastic wave filters that use a SAW and may be elastic wave filters that use a bulk acoustic wave (BAW), for example. The first filter 10 and the second filter 20 are not limited to the elastic wave filters and may be filters including an appropriate combination of, for example, a chip inductor and a chip capacitor.

The antenna wiring line 30 is a transmission line that is connected at one end to the antenna terminal Pant and is connected at the other end to the combination point N. That is, the antenna wiring line 30 is a "HOT" transmission line through which the transmission signals or the reception signals are transmitted.

The matching wiring line 40 is a transmission line that is connected at one end to the matching terminal Pmtc and is connected at the other end to the combination point N. That is, the matching wiring line 40 is connected to the combination point N without interposing the "HOT" transmission line, such as the antenna wiring line 30, therebetween.

The package substrate 50 is a substrate on which the first filter 10 and the second filter 20 are mounted, and includes various conductors that define circuits of the multiplexer 1, and an example thereof is a glass epoxy substrate. The conductors include a surface electrode that defines the terminals of the multiplexer 1 and wiring lines and via conductors that define the transmission lines of the multiplexer 1. Each conductor is preferably made of a metal such as Ti, Al, Cu, Pt, Au, Ag, or Pd or an alloy thereof, for example.

The antenna terminal Pant connects the multiplexer 1 to the antenna 2. The matching terminal Pmtc connects a matching device (here, the matching inductor 3) for matching (impedance matching) between the antenna 2 and the multiplexer 1. The transmission terminals Ptx1 and Ptx2 and the reception terminals Prx1 and Prx2 connect the multiplexer 1 to, for example, the RFIC. The terminals are disposed, for example, as surface electrodes on the lower surface of the package substrate 50.

The multiplexer 1 is preferably sealed with, for example, a sealing resin, that defines a package, and mounted on a mother substrate including other circuit components, such as the antenna and the matching inductor 3. The multiplexer 1 may not be structured into a package and may be structured such that the first filter 10 and the second filter 20 are mounted on a mother substrate including various conductors that define the circuits of the multiplexer 1.

The mounting layout of the multiplexer 1 will now be described.

Figure 3:
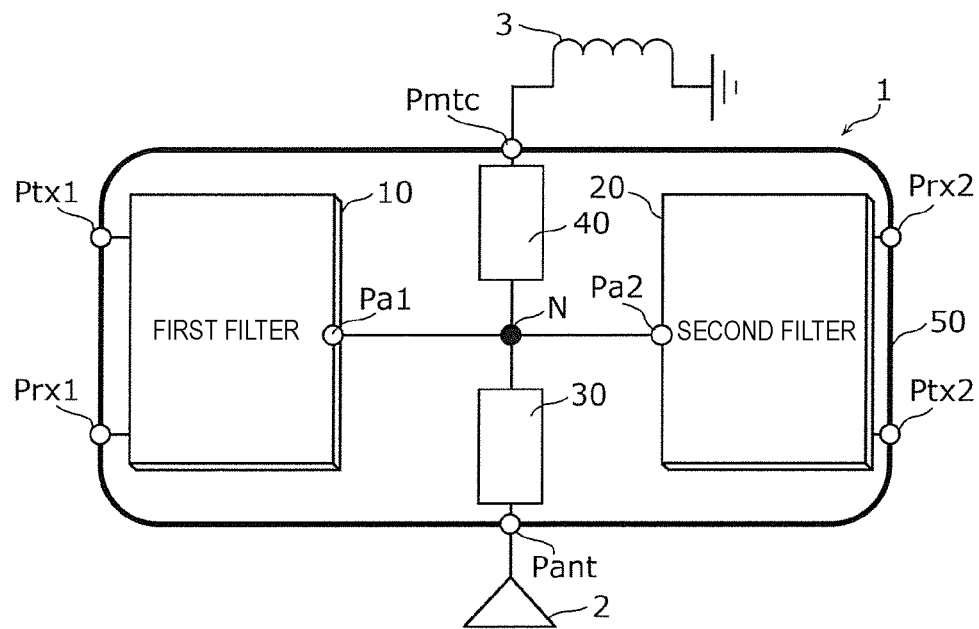
FIG. 3 is a schematic plan view of the mounting layout of a multiplexer according to a preferred embodiment of the present invention.
Figure 4:
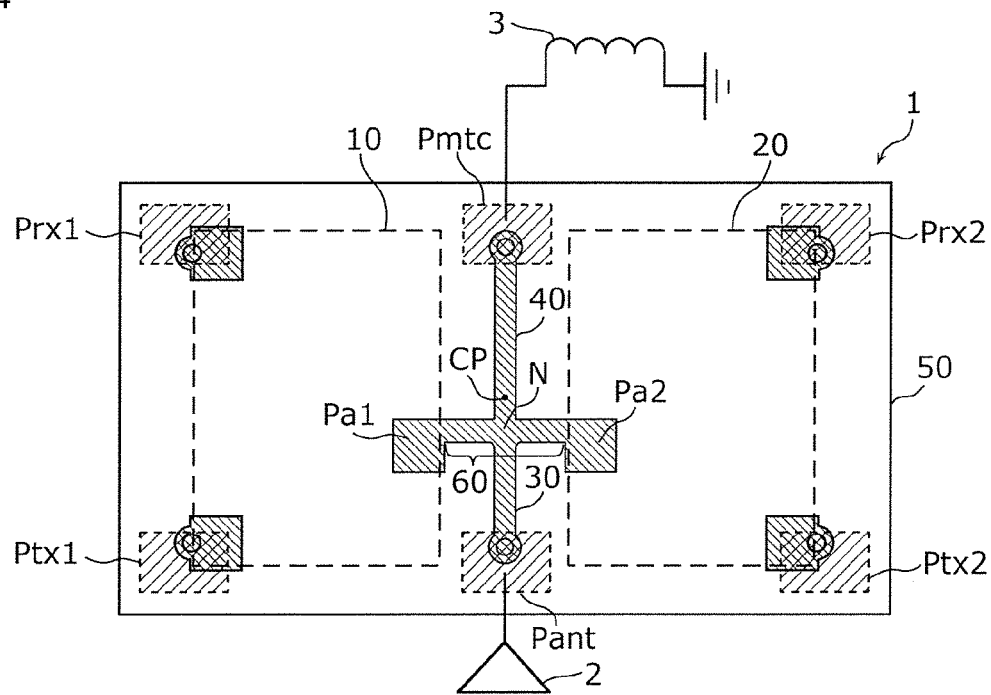
FIG. 4 is a plan view of the detail of the mounting layout illustrated in FIG. 3.

FIG. 3 is a schematic plan view of the mounting layout of the multiplexer 1 according to the present preferred embodiment. FIG. 4 is a plan view of the details of the mounting layout illustrated in FIG. 3. In these figures, the antenna 2 and the matching inductor 3 that will be connected to the multiplexer 1 are illustrated together. In FIG. 4, the first filter 10 and the second filter 20 are seen through for simplification and clarity. The same is true for the other schematic plan views or the other plan views described later.

As illustrated in FIGS. 3 and 4, the first filter 10 and the second filter 20 are arranged in the longitudinal direction on the upper surface of the package substrate 50 that has a rectangular or substantially rectangular shape in a plan view. Specifically, the first filter 10 and the second filter 20 are preferably arranged, for example, such that the terminals are symmetric with respect to an imaginary line that passes through the center CP of the package substrate 50 in a plan view.

The surface of the package substrate 50 on which the first filter 10 and the second filter 20 are disposed is referred to here as an upper surface. However, the surface may not be the upper surface depending on the usage of the multiplexer 1. Accordingly, the upper surface of the package substrate 50 is not limited to the upper surface of the multiplexer 1.

According to the present preferred embodiment, the common terminal Pa1 and the common terminal Pa2 are disposed in middle portions of the package substrate 50 in a plan view. According to the present preferred embodiment, preferably, the antenna terminal Pant, the matching terminal Pmtc, the transmission terminals Ptx1 and Ptx2, and the reception terminals Prx1 and Prx2 are disposed around the circumference of the package substrate 50. Specifically, the transmission terminals Ptx1 and Ptx2 and the reception terminals Prx1 and Prx2 are disposed near the corners of the circumference. The antenna terminal Pant and the matching terminal Pmtc are disposed in middle portions of the respective long sides of the circumference. That is, the antenna terminal Pant and the matching terminal Pmtc are preferably arranged point symmetrically or substantially point symmetrically about the center CP of the package substrate 50.

The arrangement of the terminals is not particularly limited. However, for example, the transmission terminals Ptx1 and Ptx2 and the reception terminals Prx1 and Prx2 are preferably disposed near the different corners of the package substrate 50 so as to ensure isolation.

The common terminal Pa1 and the common terminal Pa2 are connected to the antenna terminal Pant and the matching terminal Pmtc by transmission lines each preferably having a characteristic impedance of, for example, about 50Ω that the package substrate 50 includes. The transmission lines include the antenna wiring line 30, the matching wiring line 40, and a combining wiring line 60 that provides the combination point N.

The antenna wiring line 30 is connected at one end to the antenna terminal Pant, is connected at the other end to the combining wiring line 60, and is defined by, for example, a pattern wiring line on the upper surface of the package substrate 50.

The matching wiring line 40 is connected at one end to the matching terminal Pmtc, is connected at the other end to the combining wiring line 60, and is defined by, for example, a pattern wiring line on the upper surface of the package substrate 50.

According to the present preferred embodiment, the antenna wiring line 30 and the matching wiring line 40 are disposed in a region between the first filter 10 and the second filter 20 in a plan view of the package substrate 50. The other end of the antenna wiring line 30 and the other end of the matching wiring line 40 are connected to the combining wiring line 60 at the same or substantially the same position and, more specifically, connected to the center or substantially the center of the combining wiring line 60. The antenna wiring line 30 and the matching wiring line 40 are arranged on the opposite side of the combining wiring line 60 from each other in a plan view of the package substrate 50. The antenna wiring line 30 and the matching wiring line 40 are perpendicular or substantially perpendicular to the combining wiring line 60 in a plan view of the package substrate 50.

The combining wiring line 60 provides the combination point N and is defined by, for example, a pattern wiring line on the upper surface of the package substrate 50. Specifically, the combining wiring line 60 is a major wiring line of the transmission lines that connect the filters (here, the first filter 10 and the second filter 20) to each other. That is, the combining wiring line 60 corresponds to a wiring line of the transmission lines other than the antenna wiring line 30 that is branched to the antenna terminal Pant, the matching wiring line 40 that is branched to the matching terminal Pmtc, and the wiring lines that are branched to the respective filters. More specifically, the combining wiring line 60 is a wiring line that has constant or substantially constant electric characteristics and is preferably a wiring line having, for example, an electrical length equal to or less than about a quarter of the frequency band at which the multiplexer 1 is used.

According to the present preferred embodiment, the wiring lines extend linearly or substantially linearly. The shape of each wiring line, however, is not particularly limited. For example, at least one of the wiring lines may be bent.

The characteristics of the multiplexer 1 will now be described. In the following description, attention is directed to the pass band (Band5) of the second filter 20 regarding the characteristics of the multiplexer 1. The multiplexer 1 has the same or substantially the same characteristics when attention is directed to the pass band (Band12) of the first filter 10.

Figure 5:
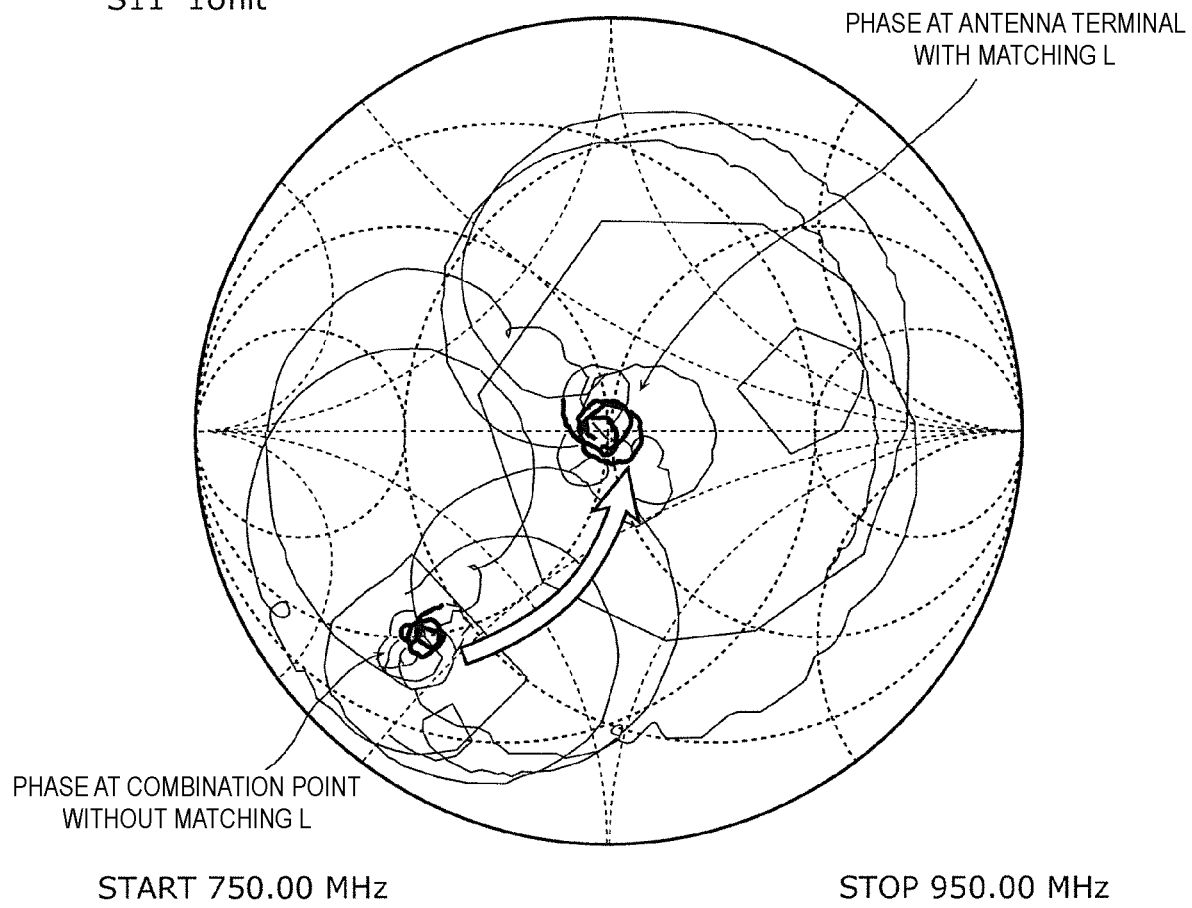
FIG. 5 is a Smith chart illustrating characteristics of a multiplexer according to a preferred embodiment of the present invention.

FIG. 5 is a Smith chart illustrating characteristics of the multiplexer 1 according to the present preferred embodiment. Specifically, FIG. 5 illustrates impedances at the combination point N with the matching inductor 3 unconnected (impedances when the first filter 10 and the second filter 20 are viewed from the combination point N), and an impedance at the antenna terminal Pant with the matching inductor 3 connected (an impedance when the inside of the multiplexer 1 is viewed from the antenna terminal Pant).

FIG. 5 illustrates trajectories of the impedances in a wide band (about 750 MHz to about 950 MHz) including the pass band of the second filter 20, and illustrates the trajectories in the pass band by thick lines.

As illustrated by a "phase at the combination point without a matching L" in FIG. 5, the impedance at the combination point N with the matching inductor 3 unconnected is located in a capacitive region (a lower half region) in the Smith chart. The reason is that, according to the present preferred embodiment, the first filter 10 and the second filter 20 included in the multiplexer 1 are preferably surface acoustic wave filters.

The impedance at the combination point N with the matching inductor 3 unconnected is located on a circle of constant conductance that passes through the center (about 50Ω) of the Smith chart. The reason is that the matching device (the matching inductor 3 according to the present preferred embodiment) that is connected to the matching terminal Pmtc is a shunt matching device that is connected between the matching terminal Pmtc and the ground potential.

That is, in the multiplexer 1 to which the shunt matching device is connected, the impedance when the inside of the multiplexer 1 is viewed from the antenna terminal Pant moves along the circle of constant conductance. Accordingly, to match the impedance at the antenna terminal Pant to a predetermined impedance (about 50Ω) with the shunt matching device connected, it is necessary for the impedance at the combination point N to be located on the circle of constant conductance that passes through the center (about 50Ω) of the Smith chart with the matching device unconnected.

In the multiplexer 1 having such characteristics to which the matching inductor 3 is connected, the impedance at the combination point N moves along the circle of constant conductance to an inductivity region. That is, the impedance at the combination point N approaches a central region of the Smith chart as a reactance component approaches 0.

At this time, a variation ΔB in the reactance component is expressed as $\Delta B = 1/(2\pi f(Lp1+Lp2))$, where Lp1 is the value of the inductance of the matching inductor 3, Lp2 is the value of an inductance in accordance with the electrical length of the matching wiring line 40, and f is the center frequency of the pass band. Accordingly, the impedance at the combination point N is able to be matched to the predetermined impedance (about 50Ω) in a manner in which the value Lp1 of the inductance of the matching inductor 3 is adjusted to an appropriate value in accordance with the length of the matching wiring line 40.

In the case in which the multiplexer 1 is mounted on, for example, a mother substrate, and the matching inductor 3 and the multiplexer 1 are connected to each other with a wiring line of the mother substrate interposed therebetween, the value of an inductance due to the wiring line is taken into consideration. Even with this structure, the impedance at the combination point N is able to be matched to the predetermined impedance in a manner in which the value of the inductance of the matching inductor 3 is adjusted without another matching device other than the matching inductor 3.

Accordingly, as illustrated by a "phase at the antenna terminal with the matching L" in FIG. 5, the impedance at the antenna terminal Pant with the matching inductor 3 connected is located in a central region of the Smith chart. That is, the impedance at the antenna terminal Pant moves so as to rotate clockwise about the center of the Smith chart with the distance from the center maintained in accordance with the electrical length of the antenna wiring line 30 between the antenna terminal Pant and the combination point N unlike the impedance at the combination point N. However, since the impedance at the combination point N is located in a central region of the Smith chart, the impedance at the antenna terminal Pant after the rotation is located in a central region of the Smith chart as in the impedance at the combination point N.

Accordingly, the multiplexer 1 according to the present preferred embodiment enables the impedance matching with a simple matching device (here, the matching inductor 3). The reason why such an effect is achieved will now be described in comparison with a comparative example of the present preferred embodiment.

Figure 6:
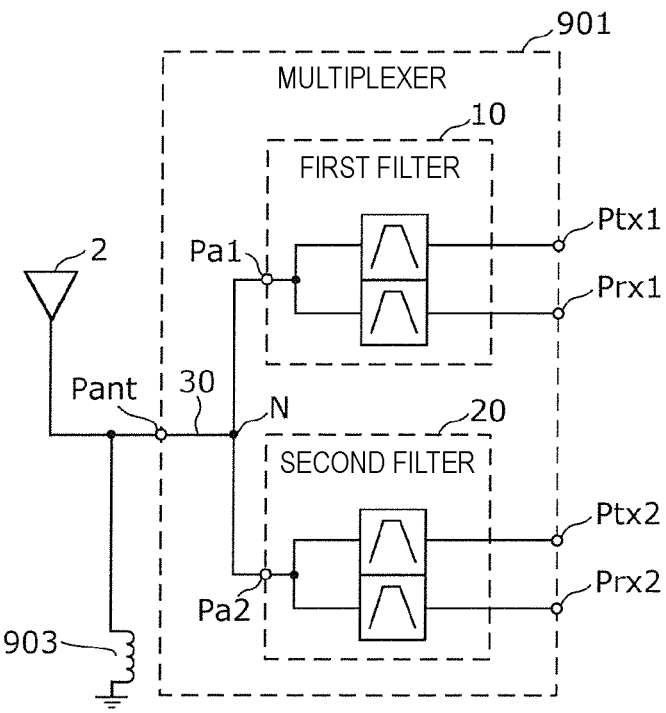
FIG. 6 is a circuit diagram of a multiplexer in a comparative example.
Figure 7:
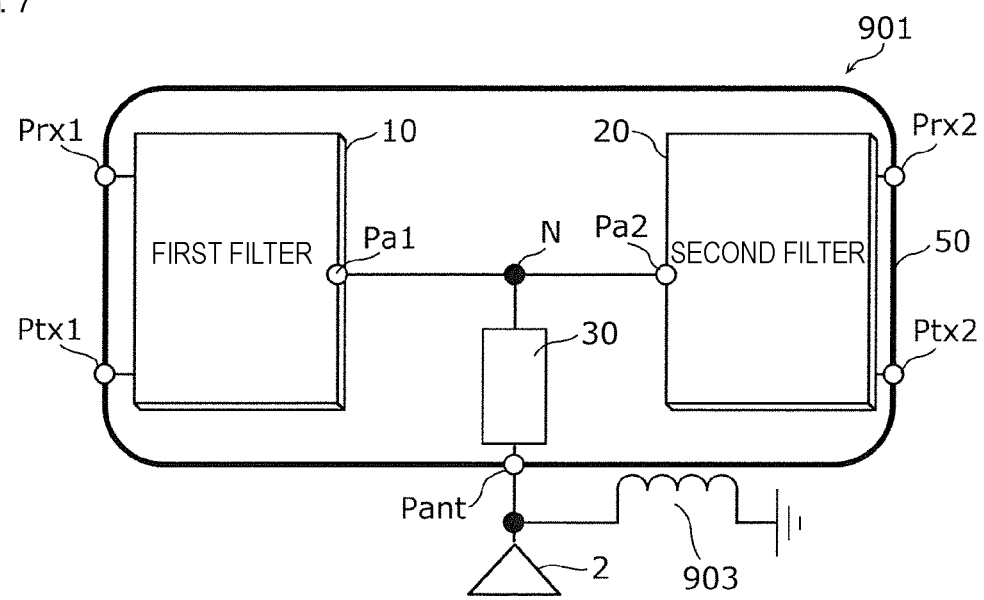
FIG. 7 is a schematic plan view of the mounting layout of the multiplexer in the comparative example.

FIG. 6 is a circuit diagram of a multiplexer 901 in the comparative example. FIG. 7 is a schematic plan view of the mounting layout of the multiplexer 901 in the comparative example.

The multiplexer 901 in the comparative example illustrated in the figures differs from the multiplexer 1 according to the present preferred embodiment in that there is no structure to connect the matching device (the matching inductor 3 according to the present preferred embodiment). Specifically, as illustrated in FIG. 6 and FIG. 7, the multiplexer 901 in the comparative example does not include the matching wiring line 40 and the matching terminal Pmtc unlike the multiplexer 1 in FIG. 2 and FIG. 3. Accordingly, in the multiplexer 901 in the comparative example, a matching inductor 903 is connected to a transmission line between the combination point N and the antenna 2.

The matching inductor 903 is a shunt inductor that is connected at one end to the transmission line between the combination point N and the antenna 2 and is connected at the other end to the ground potential. For example, the matching inductor 903 is connected at the one end to the antenna terminal Pant and is connected at the other end to the ground potential.

The antenna terminal Pant is connected to the combination point N with the antenna wiring line 30 interposed therebetween. Accordingly, even when the one end of the matching inductor 903 is directly connected to the antenna terminal Pant, a "HOT" transmission line "through which the transmission signals or the reception signals are transmitted is disposed between the one end and the combination point N.

The multiplexer 901 in the comparative example has the following characteristics.

Figure 8:
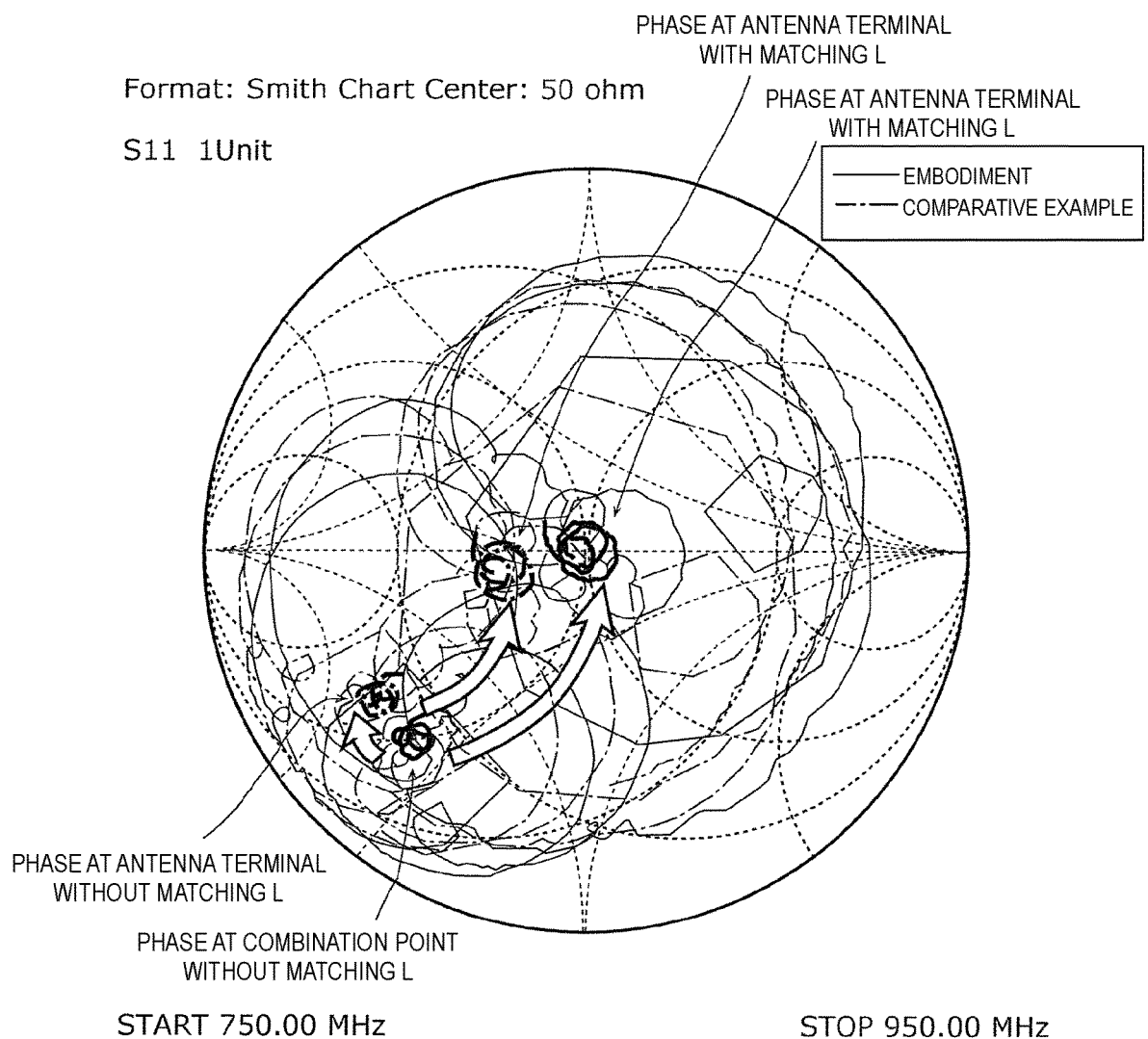
FIG. 8 is a Smith chart illustrating characteristics of the multiplexer in the comparative example.

FIG. 8 is a Smith chart illustrating characteristics of the multiplexer 901 in the comparative example. FIG. 8 also illustrates the characteristics of the multiplexer 1 illustrated in FIG. 5 for comparison.

The multiplexer 901 in the comparative example includes the same first filter 10 and the same second filter 20 as in the present preferred embodiment. Accordingly, as illustrated by a "phase at the combination point without the matching L" in FIG. 8, the impedance at the combination point N with the matching inductor 903 unconnected is located on a circle of constant conductance that passes through the center of the Smith chart and in the capacitive region in the Smith chart.

In this case, the impedance at the antenna terminal Pant with the matching inductor 903 unconnected moves so as to rotate clockwise about the center of the Smith chart with the distance from the center maintained in accordance with the electrical length of the antenna wiring line 30 between the antenna terminal Pant and the combination point N. That is, the phase rotates due to the antenna wiring line 30, and consequently, the impedance at the antenna terminal Pant moves to a low impedance side as illustrated by a "phase at the antenna terminal without the matching L" in FIG. 8.

Accordingly, the impedance at the antenna terminal Pant with the matching inductor 903 connected moves to the inductivity region along the circle of constant conductance that passes through a lower impedance side than the center of the Smith chart. Accordingly, the impedance at the antenna terminal is Pant unlikely to approach a central region of the Smith chart as illustrated in a "phase at the antenna terminal with the matching L" in FIG. 8 even when the matching inductor 903 that causes the reactance component to be 0 is connected.

The variation in the impedance due to the electrical length of the antenna wiring line 30 is able to be estimated from, for example, the length and the pass band of the antenna wiring line 30. Accordingly, it is considered that the impedance at the combination point N with the matching inductor 903 unconnected is adjusted to an impedance more than that in the comparative example to compensate for the variation in the impedance due to the electrical length of the antenna wiring line 30.

However, in the case in which the multiplexer 901 is mounted on, for example, a mother substrate, and the matching inductor 903 and the antenna terminal Pant are connected to each other with a "HOT" wiring line of the mother substrate interposed therebetween, the impedance when the multiplexer 901 is viewed from the antenna 2 is also affected by the electrical length of the wiring line. The length of the wiring line is a certain length irrelevant to the multiplexer 901. Accordingly, it is difficult for the impedance at the combination point N to be matched to an appropriate value in advance such that the variation in the impedance due to the electrical length of the wiring line is compensated for.

In the multiplexer 901 in the comparative example, the matching inductor 903 and the combination point N are connected to each other with the antenna wiring line 30, which is the "HOT" transmission line, interposed therebetween. Accordingly, the multiplexer 901 in the comparative example has a problem in that it is difficult to enable the impedance matching with a simple matching device (the matching inductor 903 in the comparative example).

In contrast, the multiplexer 1 according to the present preferred embodiment includes the matching wiring line 40 that is connected at one end to the matching terminal Pmtc and is connected at the other end to the combining wiring line 60 that provides the combination point N. Accordingly, the matching device (the matching inductor 3 according to the present preferred embodiment) is connected to the combination point N without interposing the antenna wiring line 30 therebetween, and the impedance at the antenna terminal Pant is highly unlikely to be affected by the electrical length of the antenna wiring line 30. Consequently, the multiplexer enables the impedance matching with the matching device that is simple.

The impedance matching at the antenna terminal Pant achieves the following effects.

Figure 9A:
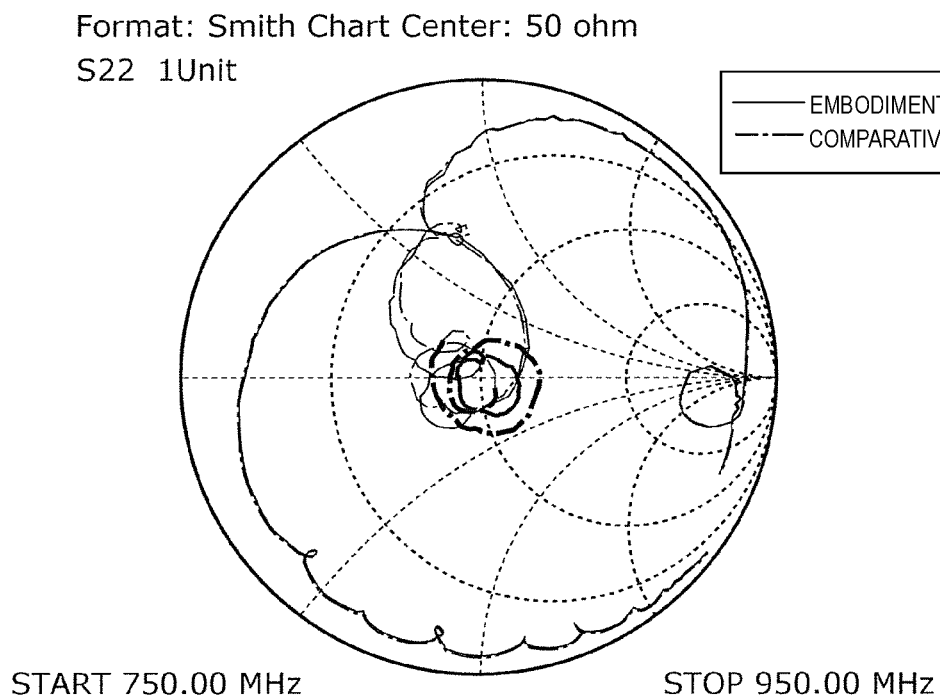
FIG. 9A is a Smith chart illustrating other characteristics of a multiplexer according to a preferred embodiment of the present invention.
Figure 9B:
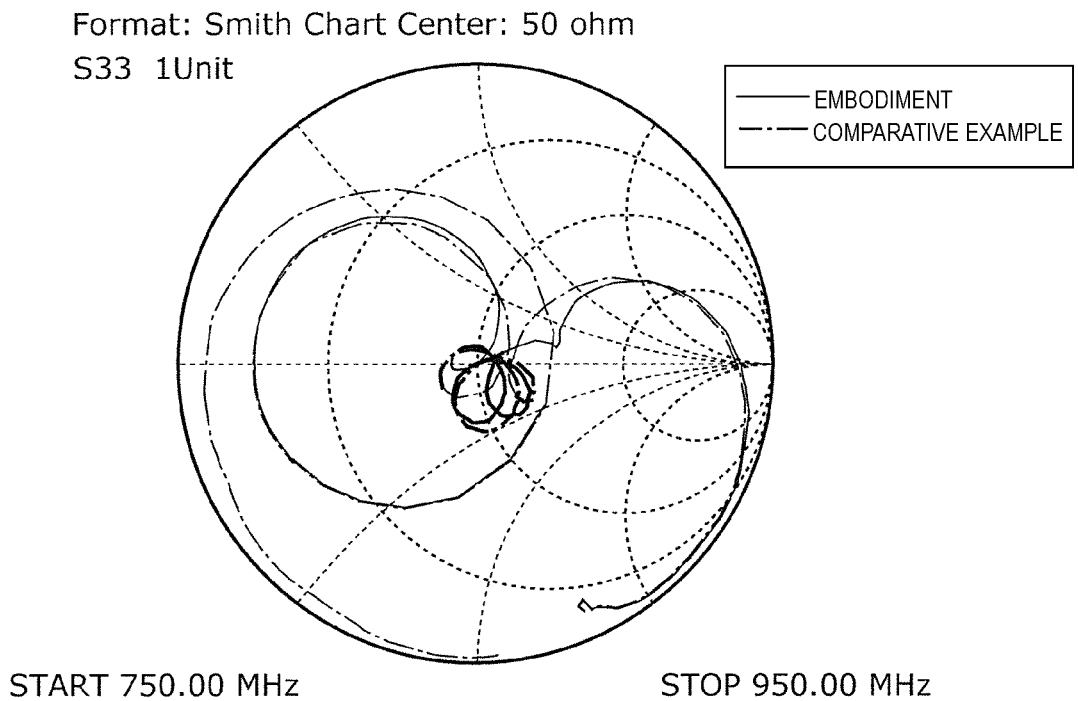
FIG. 9B illustrates a Smith chart of other characteristics of a multiplexer according to a preferred embodiment of the present invention.

FIGS. 9A and 9B are Smith charts illustrating characteristics of the multiplexer 1 according to the present preferred embodiment. Specifically, FIG. 9A illustrates an impedance at the transmission terminal Ptx2 (an impedance when the inside of the multiplexer 1 is viewed from the transmission terminal Ptx2) with the matching inductor 3 connected. FIG. 9B illustrates an impedance at the reception terminal Prx2 (an impedance when the inside of the multiplexer 1 is viewed from the reception terminal Prx2) with the matching inductor 3 connected.

Both of FIGS. 9A and 9B also illustrate the impedance at the transmission terminal Ptx2 and the impedance at the reception terminal Prx2 with the matching inductor 903 connected to the multiplexer 901 in the comparative example.

As illustrated in FIGS. 9A and 9B, according to the present preferred embodiment, the degree of concentration of winding of each impedance in the pass band is improved at a central region of the Smith chart, unlike the comparative example. That is, the present preferred embodiment enables the impedance matching, unlike the comparative example, and enables VSWR (Voltage Standing Wave Ratio) in the transmission pass band and the reception pass band of Band5 to be improved.

According to the present preferred embodiment, the antenna wiring line 30 and the matching wiring line 40 are connected to the combining wiring line 60 at the same or substantially the same position, and accordingly, the number of connection nodes of the combining wiring line 60 is decreased. Consequently, an area in which the connection nodes are disposed is small, and the size of the multiplexer 1 is decreased.

According to the present preferred embodiment, the antenna wiring line 30 and the matching wiring line 40 are arranged on the opposite side of the combining wiring line 60 from each other in a plan view of the substrate (the package substrate 50 according to the present preferred embodiment). This enables the area in which the antenna wiring line 30 and the matching wiring line 40 are disposed to be small, and enables the size of the multiplexer 1 to be decreased.

According to the present preferred embodiment, the antenna wiring line 30 and the matching wiring line 40 are perpendicular or substantially perpendicular to the combining wiring line 60 in the plan view. This enables the area in which the antenna wiring line 30 and the matching wiring line 40 are disposed to be even smaller, and enables the size of the multiplexer 1 to be further decreased.

According to the present preferred embodiment, the antenna terminal Pant and the matching terminal Pmtc are arranged point symmetrically or substantially point symmetrically about the center CP of the substrate (the package substrate 50 according to the present preferred embodiment). Accordingly, the multiplexer 1 is able to be used for, for example, a mother substrate in which the arrangement of the first filter 10 and the second filter 20 is reversed.

The present preferred embodiment of the multiplexer may be changed. Various modifications to the present preferred embodiment will now be described. In the following description, the same aspects as the present preferred embodiment are appropriately omitted, and differences from the preferred embodiment are primarily described.

First Modification

According to the preferred embodiments described above, the antenna wiring line 30 and the matching wiring line 40 are connected to the combining wiring line 60 at the same or substantially the same position. However, the position at which the antenna wiring line 30 and the matching wiring line 40 are connected is not limited thereto. For example, the antenna wiring line 30 and the matching wiring line 40 may be connected to the combining wiring line 60 at different positions. A multiplexer configured according to a first modification to a preferred embodiment of the present invention will now be described.

Figure 10:
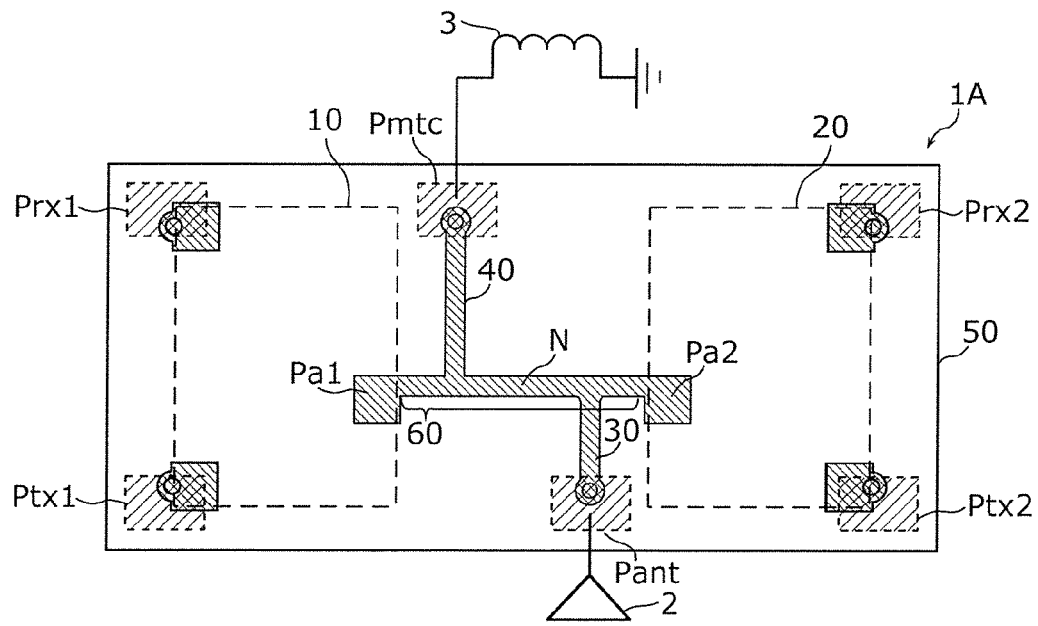
FIG. 10 is a plan view of the detail of the mounting layout of a multiplexer according to a first modification to a preferred embodiment of the present invention.

FIG. 10 is a plan view of the details of the mounting layout of a multiplexer 1A according to the first modification to a preferred embodiment.

According to the present modification, as illustrated in FIG. 10, the antenna wiring line 30 and the matching wiring line are connected to the combining wiring line 60 at different positions. That is, the antenna wiring line 30 is connected at one end to the antenna terminal Pant, the matching wiring line 40 is connected at one end to matching terminal Pmtc, and the other ends thereof are connected to the combining wiring line 60 at different positions.

Also in the multiplexer 1A, the matching device, such as the matching inductor 3, may preferably be connected to the combination point N without interposing the antenna wiring line 30 therebetween, as in the preferred embodiments described above. Accordingly, the multiplexer 1A according to the present modification enables the impedance matching with the matching device that is simple as in the preferred embodiments described above.

Second Modification

According to the preferred embodiments described above, the antenna wiring line 30 and the matching wiring line 40 are arranged on the opposite side of the combining wiring line 60 from each other in a plan view of the package substrate 50, and are perpendicular or substantially perpendicular to the combining wiring line 60. The antenna terminal Pant and the matching terminal Pmtc are arranged point symmetrically or substantially point symmetrically about the center CP of the package substrate 50.

However, the arrangement of the antenna wiring line 30 and the matching wiring line 40 and the arrangement of the antenna terminal Pant and the matching terminal Pmtc are not limited thereto. In a multiplexer that will now be described according to a second modification to a preferred embodiment of the present invention, the arrangement of the antenna wiring line 30 and the matching wiring line 40 and the arrangement of the antenna terminal Pant and the matching terminal Pmtc differ from those in the preferred embodiments described above.

Figure 11:
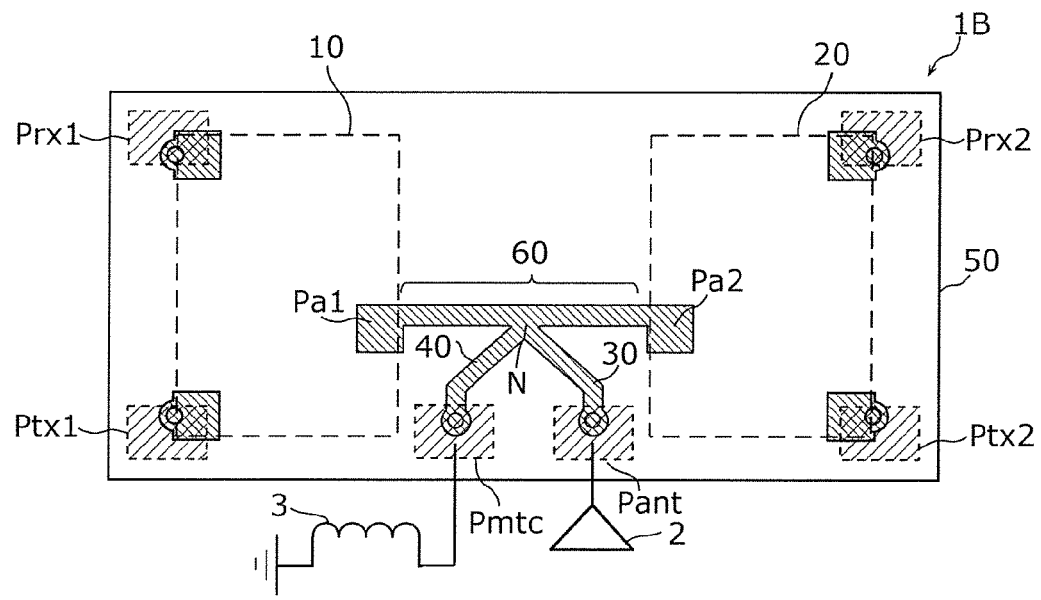
FIG. 11 is a plan view of the detail of the mounting layout of a multiplexer according to a second modification to a preferred embodiment of the present invention.

FIG. 11 is a plan view of the detail of the mounting layout of a multiplexer 1B according to the second modification to a preferred embodiment.

According to the present modification, as illustrated in FIG. 11, the antenna terminal Pant and the matching terminal Pmtc are not arranged point symmetrically or substantially point symmetrically about the center of the package substrate 50 and, specifically, are disposed on the same side of the combining wiring line 60 in a plan view of the package substrate 50. That is, although the antenna terminal Pant and the matching terminal Pmtc according to the preferred embodiments described above are disposed on the two opposing sides of the package substrate 50 having a rectangular or substantially rectangular shape in a plan view, the antenna terminal Pant and the matching terminal Pmtc according to the present modification are disposed on the same side thereof.

Consequently, according to the present modification, the antenna wiring line 30 and the matching wiring line 40 are disposed on the same side of the combining wiring line 60 in a plan view of the package substrate 50. The antenna wiring line 30 and the matching wiring line 40 are connected to the combining wiring line 60 at angles (preferably, for example, about 45°) that differ from the right angle in the plan view.

Also in the multiplexer 1B, the matching device, such as the matching inductor 3, is able to be connected to the combination point N without interposing the antenna wiring line 30 therebetween as in the preferred embodiments described above. Accordingly, the multiplexer 1B according to the present modification enables the impedance matching with the matching device that is simple as in the preferred embodiments described above.

Third Modification

According to the preferred embodiments described above, the multiplexer 1 is connected to an external matching device, such as the matching inductor 3. The matching device, however, may be included in the multiplexer.

Figure 12:
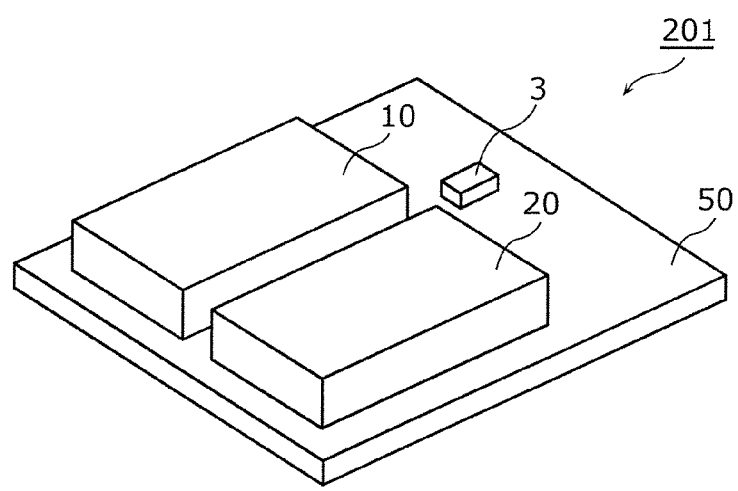
FIG. 12 is a perspective view of an example of the appearance of a multiplexer according to a third modification to a preferred embodiment of the present invention.

FIG. 12 is a perspective view of an example of the appearance of a multiplexer 201 according to a third modification to a preferred embodiment of the present invention.

As illustrated in FIG. 12, the multiplexer 201 differs from the multiplexer 1 illustrated in FIG. 1 in that it includes the matching inductor 3 that is connected to the matching terminal Pmtc. According to the preferred embodiments described above, the matching terminal Pmtc is an external-connection terminal of the multiplexer 1. According to the present modification, however, the matching terminal Pmtc is a connection terminal included in the multiplexer 201.

An example of the matching inductor 3 is a chip inductor that is connected between the matching terminal Pmtc and the ground potential. The matching inductor 3 has an inductance that causes the impedance at the antenna terminal Pant to match the predetermined impedance (about 50Ω) due to a combined inductance of the matching inductor and the matching wiring line 40 having an inductance that is determined in accordance with the electrical length. For example, the matching inductor 3 is connected to the matching terminal Pmtc that is disposed on the upper surface of the package substrate 50 and mounted on the upper surface of the package substrate 50.

The multiplexer 201 according to the present modification includes the matching device (the matching inductor 3 according to the present modification) as described above, and enables the impedance matching without an external matching device.

In the multiplexer 201 according to the present modification, the matching inductor 3 has an inductance that causes the impedance at the antenna terminal Pant to match the predetermined impedance (about 50Ω) due to the combined inductance of the matching inductor 3 and the matching wiring line 40. Accordingly, the multiplexer 201 enables the impedance matching more successfully.

Figure 13:
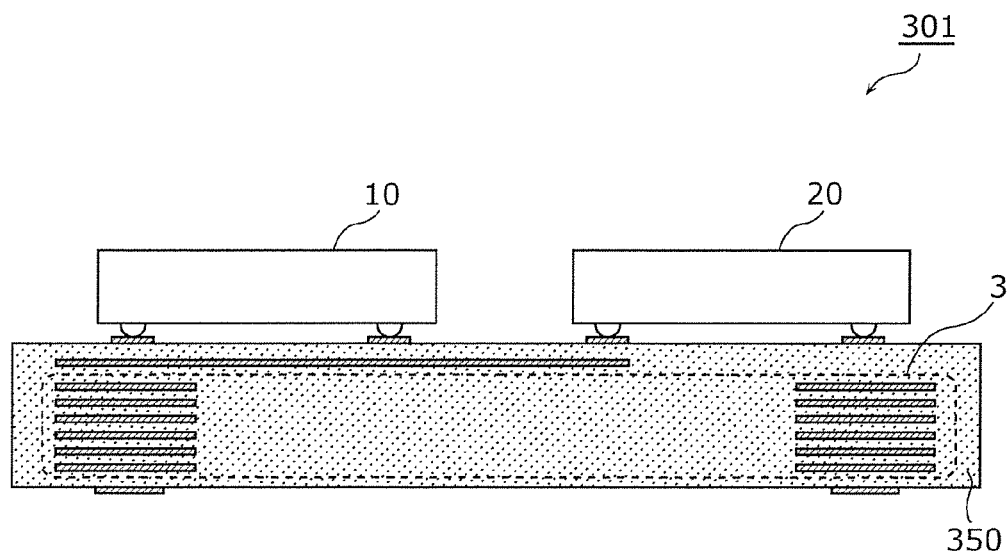
FIG. 13 illustrates the concept of a sectional structure of another example of a multiplexer according to the third modification to a preferred embodiment of the present invention.

The matching inductor 3 is not limited to a chip inductor and may be included in the multilayer substrate. FIG. 13 illustrates an example of a sectional structure of a multiplexer 301. FIG. 13 illustrates a side view of the first filter 10 and the second filter 20.

As illustrated in FIG. 13, the multiplexer 301 includes a multilayer substrate 350 on which the first filter 10 and the second filter 20 are mounted, instead of the package substrate 50 illustrated in FIG. 12. The multilayer substrate 350 includes various conductors defining the circuits of the multiplexer 301 and various conductors (for example, a loop in-plane conductor and an interlayer conductor that extends through layers in the thickness direction) defining the matching inductor 3. Accordingly, with this structure, the matching terminal Pmtc may not be disposed on a surface of the multilayer substrate 350 and may be disposed in an inner layer.

The multiplexer 301 achieves the same or substantially the same effects as the multiplexer 201. In the multiplexer 301, the first filter 10 and the second filter 20 are mounted on the multilayer substrate 350 that includes the matching inductor 3, and accordingly, the size is further decreased.

Fourth Modification

In an example according to the preferred embodiments described above, the multiplexer includes the filters (the first filter 10 and the second filter 20 described above) that are duplexers. However, the filters are not limited to duplexers and may be, for example, reception filters that filter the reception pass band. According to the preferred embodiments described above, the multiplexer 1 preferably includes the two filters (the first filter 10 and the second filter 20). However, it is only necessary for the multiplexer to include a plurality of the filters, and, for example, three filters may be included therein. A multiplexer according to a fourth modification to a preferred embodiment of the present invention that will now be described is thus provided.

Figure 14:
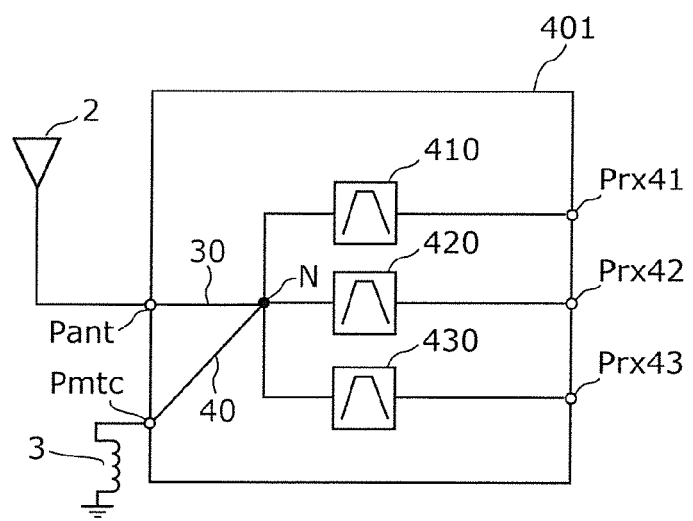
FIG. 14 is a circuit diagram of a multiplexer according to a fourth modification to a preferred embodiment of the present invention.

FIG. 14 is a circuit diagram of a multiplexer 401 according to the fourth modification to a preferred embodiment.

The multiplexer 401 illustrated in FIG. 14 is a triplexer that includes three filters 410, 420, and 430 that support three different reception pass bands and outputs, from reception terminals Prx41 to Prx43 corresponding to the respective bands, the reception signals input into the antenna terminal Pant. The inputs of the filters 410, 420, and 430 are connected to each other (that is, combined) at the combination point N.

Also in the multiplexer 401 used for reception, the matching device, such as the matching inductor 3, is able to be connected to the combination point N without interposing the antenna wiring line 30 therebetween, and the same or substantially the same effects as in the multiplexer 1 according to the preferred embodiment described above used for transmission and reception is able to be achieved.

The same techniques as described above may be used for a multiplexer including transmission filters. The same techniques as described above may also be used for a duplexer including a transmission filter and a reception filter.

Although the multiplexers according to preferred embodiments and the modifications to preferred embodiments of the present invention are described above, the present invention is not limited to the preferred embodiments or the modifications to the preferred embodiments. Preferred embodiments obtained by modifying the preferred embodiments described above and the modifications to the preferred embodiments described above with the idea of a person skilled in the art, and preferred embodiments obtained from combinations of features of the preferred embodiments and modifications to the preferred embodiments are within the range of one or more preferred embodiments of the present invention without departing from the spirit of the present invention.

For example, although the matching inductor 3 is an example of the matching device in the above description, the matching device is not limited thereto. For example, when the impedance at the combination point N is located in the inductivity region (an upper half region) in the Smith chart with the matching device unconnected, the multiplexer may include a capacitor defining the matching device.

For example, although the predetermined impedance for the impedance matching is about 50 Ω in the above description, the predetermined impedance is not limited thereto. For example, when the multiplexer is used for, for example, 75-ohm communication equipment, the predetermined impedance may be about 75Ω. When the characteristic impedance of the transmission line that connects the antenna 2 and the multiplexer to each other is determined in accordance with the input impedance of the antenna 2, the predetermined impedance may be the input impedance of the antenna 2.

The antenna wiring line 30, the matching wiring line 40, and the combining wiring line 60 are not limited to the pattern wiring lines on the upper surface of the substrate, and at least portions thereof may be defined by a pattern wiring line and a via conductor that are in an inner layer or on the lower surface of the substrate.

Preferred embodiments of the present invention may be widely used as multiplexers that each enable the impedance matching with a simple matching device for communication equipment, such as a cellular phone, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A multiplexer comprising:
at least two filters;

a combining wiring line that provides a combination point at which an input side or an output side of each of the at least two filters is connected to each other;

an antenna terminal to connect the multiplexer to an antenna;

an antenna wiring line that is connected at one end to the antenna terminal and that is connected at another end to the combining wiring line;

a matching terminal to which a matching device to provide matching between the antenna and the multiplexer is to be connected; and a matching wiring line to be connected at one end to the matching terminal and connected at another end to the combining wiring line.

2. The multiplexer according to claim 1, wherein the another end of the antenna wiring line and the another end of the matching wiring line are connected to the combining wiring line at a same or substantially a same position.

3. The multiplexer according to claim 1, further comprising:

a substrate including the antenna wiring line and the matching wiring line; wherein the antenna wiring line and the matching wiring line are located on opposite sides of the combining wiring line from each other in a plan view of the substrate.

4. The multiplexer according to claim 3, wherein the antenna wiring line and the matching wiring line are perpendicular or substantially perpendicular to the combining wiring line in the plan view of the substrate.

5. The multiplexer according to claim 1, wherein the matching device is connected to the matching terminal.

6. The multiplexer according to claim 5, wherein the matching device is an inductor that is connected between the matching terminal and a ground potential; and the inductor has an inductance that causes an impedance at the antenna terminal to match a predetermined impedance due to a combined inductance of the inductor and the matching wiring line having an inductance that is determined in accordance with an electrical length.

7. The multiplexer according to claim 1, wherein each of the at least two filters is a duplexer including a transmission filter and a reception filter.

8. The multiplexer according to claim 1, wherein each of the at least two filters is a piezoelectric chip including a surface acoustic wave filter.

9. The multiplexer according to claim 1, further comprising:

a package substrate; wherein the at least two filters are mounted on the package substrate.

10. The multiplexer according to claim 9, wherein the package substrate is a glass epoxy substrate.

11. The multiplexer according to claim 1, wherein the multiplexer is sealed with a sealing resin.

12. The multiplexer according to claim 9, wherein the package substrate has a rectangular or substantially rectangular shape;

the at least two filters include a first filter and a second filter; and the first and second filters are arranged in a longitudinal direction on an upper surface of the package substrate.

13. The multiplexer according to claim 1, wherein the another end of the antenna wiring line and the another end of the matching wiring line are connected to the combining wiring line at different positions.

14. The multiplexer according to claim 1, further comprising:

a substrate including the antenna wiring line and the matching wiring line; wherein the antenna wiring line and the matching wiring line are located on a same side of the combining wiring line in a plan view of the substrate.

15. The multiplexer according to claim 14, wherein the antenna wiring line and the matching wiring line are connected to the combining wiring line at angles that differ from a right angle in the plan view.

16. The multiplexer according to claim 14, wherein each of the antenna wiring line and the matching wiring line is connected to the combining wiring line at an angle of about 45°.

* * * * *